United States Patent [19]

Wong et al.

[11] Patent Number: 4,531,015

[45] Date of Patent: Jul. 23, 1985

[54] PIN AMORPHOUS SILICON SOLAR CELL WITH NITROGEN COMPENSATION

[75] Inventors: Boon Wong, Reseda; Don L. Morel, Agoura Hills; Victor L. Grosvenor, Woodland Hills, all of Calif.

[73] Assignee: Atlantic Richfield Company, Los Angeles, Calif.

[21] Appl. No.: 599,413

[22] Filed: Apr. 12, 1984

[51] Int. Cl.³ ............................................. H01L 31/06
[52] U.S. Cl. ..................................... 136/258; 357/30
[58] Field of Search ............... 136/258 AM; 357/2, 30

[56] References Cited

U.S. PATENT DOCUMENTS

| 4,379,943 | 4/1983 | Yang et al. | 136/249 TJ |
| 4,387,387 | 6/1983 | Yamazaki | 357/30 |
| 4,398,054 | 8/1983 | Madan | 136/255 |
| 4,415,760 | 11/1983 | Madan | 136/258 |

Primary Examiner—Aaron Weisstuch
Attorney, Agent, or Firm—Albert C. Metrailer

[57] ABSTRACT

A PIN amorphous silicon solar cell including a nitrogen compensated intrinsic inter-layer adjacent to the P type layer forming the light receiving face of the cell.

11 Claims, 1 Drawing Figure

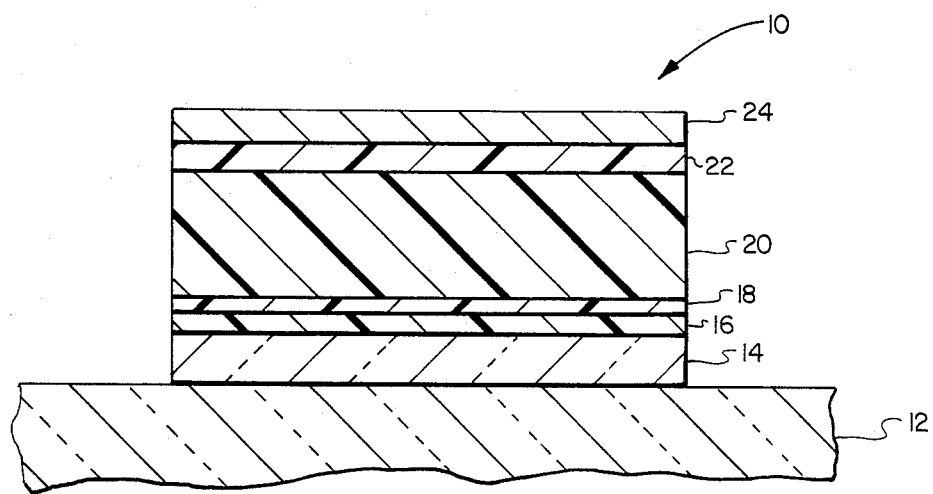

PIN AMORPHOUS SILICON SOLAR CELL WITH NITROGEN COMPENSATION

BACKGROUND OF THE INVENTION

This invention relates to thin film solar cells and more specifically to a PIN amorphous silicon solar cell in which a nitrogen compensated intrinsic inter-layer is provided between the front face P type layer and the intrinsic layer.

Silicon photovoltaic, or solar, cells have been manufactured in single crystal, polycrystalline, and thin film forms. It is believed that the thin film silicon cell will eventually displace the other types due to the dramatic reduction in qunatity of silicon used per watt of output power. Much effort has been extended in improving the reliability and efficiency of such thin film solar cells. Efficiency improvements reduce the cell area required per watt of output and thereby reduce the cost of materials, including silicon, used per watt of output power.

For example, U.S. Pat. Nos. 4,398,054 and 4,415,760 issued to Madan on Aug. 9, 1983 and Nov. 15, 1983 teach the use of a thin insulating layer between the intrinsic amorphous silicon layer and an N type layer forming the light receiving face of the cell. This insulating layer is preferably 3 nanometers thick and formed of materials such as $Si_3N_4$, $SiO_2$, BN, $Ta_2O_5$, $Nb_2O_5$, and the like. Madan teaches that such an insulating layer increases the quantum efficiency of the solar cell in the blue region of the solar spectrum.

U.S. Pat. No. 4,387,387 issued to Yamazaki on June 7, 1983 likewise teaches improvements in thin film silicon solar cells. The particular improvement is a thin nitride layer formed between the light receiving face of the solar cell structure and the transparent conductive contact normally applied to such light receiving face. Yamazaki teaches that this nitride layer inhibits the passage of undesirable impurities into the semiconductor layer and that such undesirable impurities would reduce the efficiency of the solar cell.

In both Madan and Yamazaki the additional layer of, for example, $Si_3N_4$ is a true insulator having resistivity. As a result it is essential in using such materials that layer thickness be very carefully controlled to avoid increasing device resistance and thereby reducing device efficiency.

SUMMARY OF THE INVENTION

An object of the present invention is to provide a thin film solar cell structure having improved efficiency especially in the short wavelength region.

Another object of the present invention is to provide an improved thin film solar cell structure which is easily reproduceable.

A thin film solar cell structure according to the present invention includes a basic PIN cell in which a thin nitrogen doped intrinsic inter-layer is incorporated between the conventional intrinsic layer and the P type layer which forms the light receiving face of the cell. In a preferred form, the N type layer opposite the light receiving face of the cell also contains nitrogen.

BRIEF DESCRIPTION OF THE DRAWING

The present invention may be better understood by reading the following detailed description of the preferred embodiments with reference to the accompanying single FIGURE which is a cross-sectional illustration of a solar cell structure according to the present invention.

DESCRIPTION OF THE PREFERRED EMBODIMENTS

With reference now to the FIGURE, there is illustrated a basic solar cell structure according to the present invention. The cell 10 is fabricated on a transparent substrate 12 which in the preferred embodiment is purchased with a transparent conductor, TC, layer 14 in place. In this preferred embodiment, substrate 12 is a relatively inexpensive soda lime glass having a thickness of about one millimeter. TC layer 14 is typically 4000 to 5000 angstroms thick and is formed primarily from tin axide, but may be doped with materials such as indium or fluorine as is well known in the art. Layer 14, as well as other layers of the device, may be patterned by various techniques well known in the art such as laser scribing.

The active solar cell structure of the preferred embodiment is formed primarily of a P type layer 16, an intrinsic (I) layer 20 and an N type layer 22 of amorphous hydrogenated silicon. According to the present invention, an additional inter-layer 18 of nitrogen doped intrinsic amorphous hydrogenated silicon is provided between P type layer 16 and the basic intrinsic layer 20. Layer 16 is typically about 100 to 125 angstroms thick and is doped with boron. The intrinsic layer 20 is typically about 4000 to 7000 angstroms thick. The N type layer 22 is typically about 400 to 600 angstroms thick and is doped with phosphorous to achieve the N type conductivity. Layer 18, in the preferred embodiment, is preferably about 50 to 100 angstroms thick but has been found to provide improved performance in the short wavelength portion of the spectrum in a thickness range of from 20 to 1000 angstroms. Layer 18 is doped with nitrogen in a concentration of from two atomic percent to five atomic percent. In the preferred embodiment the N type conductivity layer 22 is alloyed with nitrogen in a silicon to nitrogen atomic ratio of from about 3 to 1 to about 11 to 2.

A back electrical contact 24 is formed on layer 22 to complete the structure by providing means for contacting the back face of the device 10. Layer 24 is, in the preferred embodiment, formed from aluminum deposited to a thickness of about 2000 angstroms. Layer 24 may, of course, be formed from other conductive materials, including transparent conductors such as are typically used for layer 14.

Nitrogen compensation of the inter-intrinsic layer adjacent the P type layer provides an abrupt potential drop and a high local electric field for electrons at the PI interface. This nitrogen compensation may also reduce the defect density and thus improve carrier lifetime near the PI interface. Consequently, use of the nitrogen doped intrinsic inter-layer according to the present invention has resulted in substantial improvement of short wavelength response of the solar cells relative to devices without such a compensated inter-layer.

Two reference cells, herein referred to as references 1 and 2, and three examples of the present invention, herein referred to as samples 1, 2 and 3, were fabricated in an RF activated glow discharge chamber. For this experimental work, the chamber was built from a conventional diffusion furnace having an eight inch inner diameter quartz tube appropriately modified for capacitive application of RF power at 13.56 MHz and for providing reactive gas flow at appropriate vacuum levels. Layers 16, 20, and 22 of the reference cells and layers 16, 18, 20, and 22 of the sample cells were deposited sequentially on the TC coated substrate without removal of the cells from the chamber between steps. The chamber was maintained at 240° C. during all deposition steps using conventional external resistance heaters.

The P type layer 16 was deposited under the same conditions for all reference and sample cells. The reactive gas used for the P layer comprises $SiH_4$ flowing at 30 cc/m, 1% $B_2H_6$ diluted in $H_2$ flowing at 3 cc/m, and $CH_4$ flowing at 80 cc/m. Pressure was maintained at 0.58 torr while 20 watts of RF energy was applied for one minute. The resulting layer had an estimated thickness of 125 angstroms. The estimated properties of P type layer 16 were: conductivity of about $10^{-6}$ (ohm cm)$^{-1}$; activation energy of dark conductivity of about 0.4 eV; psuedo-optical bandgap at an absorption coefficient of $10^4$ cm$^{-1}$ of about 2 eV; and refractive index at 700 nm wavelength of about 3.0.

For reference cells 1 and 2 the I layer 20 was then deposited after the chamber was appropriately evacuated. The reactive gas comprised $SiH_4$ flowing at about 50 cc/m and argon flowing at about 150 cc/m. Chamber pressure was maintained at 0.5 torr while 30 watts of RF power was applied for thirty-five minutes. This procedure provided a layer 20 having a thickness of about 6000 angstroms.

Layer 20 had the following estimated properties: photo-conductivity of about $10^{-5}$ (ohm cm)$^{-1}$; dark conductivity of $10^{-11}$ (ohm cm)$^{-1}$; activation energy of dark conductivity of about 0.72 eV; pseudo-optical bandgap at an absorption coefficient of $10^4$ cm$^{-1}$ of about 1.8 eV; and refractive index at 700 nm wavelength of about 3.7

For reference cells 1 and 2 the chamber was again evacuated and an N type layer 22 was then deposited. Reactive gases comprised $NH_3$ flowing about 10 cc/m, 0.94% $PH_3$ diluted in $H_2$ flowing at 50 cc/m, $SiH_4$ flowing at about 40 cc/m, and $H_2$ flowing at about 150 cc/m. Chamber pressure was maintained at 0.5 torr while 40 watts of RF power was applied for 4.5 minutes. The resulting N type nitrogenated layer 22 had an estimated thickness of 500 angstroms.

Layer 22 had the following estimated properties: conductivity of about $5 \times 10^{-4}$ (ohm cm)$^{-1}$; activation energy of dark conductivity of about 0.25 eV; pseudo-optical bandgap at an absorption coefficient of $10^4$ cm$^{-1}$ of about 2 eV; and refractive index at 700 nm wavelength of about 3.3.

After the above processes, reference cells 1 and 2 were moved to another chamber for evaporation of an aluminum layer 24 to a thickness of about 2000 angstroms.

As indicated above, fabrication of sample 1 began by depositing a P type layer 16 as described above for the reference cells. After appropriate evacuation of the deposited chamber, the nitrogen compensated layer 18 of the present invention was deposited. Reactive gases comprised $NH_3$ flowing at 3 cc/m, $SiH_4$ flowing at 50 cc/m, and argon, acting as a diluent, flowing at 150 cc/m. The chamber was maintained at 0.5 torr while 30 watts of RF power was applied for thirty seconds. This procedure provided a nitrogen compensated intrinsic amorphous silicon inter-layer 18 having an estimated thickness of 90 angstroms, and an estimated composition of five atomic percent nitrogen, 85 atomic percent silicon, and ten atomic percent hydrogen.

Sample cell 1 was thereafter completed by depositing an intrinsic layer 20 and a nitrogen alloyed N type conductivity layer 22 under the same conditions as described above with respect to references 1 and 2. Likewise, an aluminum back contact 24 was thereafter deposited on sample 1 to provide a back electrical contact.

Fabrication of sample 2 began by depositing a P type layer 16 on TC coated glass under the conditions described above for the reference cells. After appropriate evacuation of the deposition chamber, a nitrogen compensated intrinsic amorphous silicon inter-layer was deposited on layer 16 using the same reactive gas composition as used for sample 1 and the same operating conditions except that RF power was applied for only 15 seconds. Layer 18 of sample 2 therefore had an estimated thickness of about 45 angstroms, and the same composition as layer 18 of sample 1.

Sample 2 was completed by depositing an intrinsic layer 20 and a nitrogen alloyed N type layer 22 under the same conditions as described above for the reference cells except that the deposition time for the intrinsic layer 20 was reduced to 26.25 minutes, resulting in an estimated thickness of 4600 angstroms. A thin film aluminum back contact was then deposited on layer 22 as described above.

Sample 3 fabrication again began with deposition of the standard P type silicon layer 16 as described above for the other cells. After appropriate evacuation of the deposition chamber, a nitrogen compensated intrinsic amorphous silicon inter-layer 18 was deposited on layer 16. Reactive gases for this layer 18 comprised $NH_3$ flowing at about 2 cc/m, $SiH_4$ flowing at 50 cc/m, and argon, acting as a diluent, flowing at 150 cc/m. The operating conditions were the same as for sample 2, that is the chamber was maintained at 0.5 torr vacuum level while 30 watts of RF power was applied for 15 seconds. The resulting nitrogen doped intrinsic layer 18 had an estimated thickness of 45 angstroms and a nitrogen concentration estimated to be three atomic percent.

After appropriate evacuation of the deposition chamber, an intrinsic layer 20 was provided for sample 3 using the same reactive gas composition and flow rates and operating conditions as described above with respect to the reference cells except that deposition time was reduced to 20 minutes. The resulting I layer 20 had an estimated thickness of 3500 angstroms. Thereafter a nitrogen compensated N conductivity type layer 22 was provided under the same conditions as discussed above with respect to the reference cells. Sample 3 was again completed by application of an aluminum back contact 24.

Spectral response curves of the reference and sample devices show a significant efficiency improvement in the lower half of the visible light spectrum. For example, at about 380 nanometers wavelength, the two reference cells had quantum efficiencies of about 60% and 68%. In contrast, at the same wavelength, sample 1 had an efficiency of about 86%, sample 2 had an efficiency of about 92%, and sample 3 had a efficiency of about 90%. At a wavelength of 500 nanometers, references 1 and 2 had efficiencies of about 78% and 81% respectively while samples 1, 2, and 3 had quantum efficiencies of 86%, 87%, and 89% respectively. At 600 nanometers wavelength, the reference cells had efficiencies roughly corresponding to that of the two sample cells. Beyond 600 nanometers, the sample cell efficiencies were slightly lower than the reference cells. At these wavelengths above 600 nanometers, the sample cell efficiencies roughly correspond to the efficiencies of a cell similar to the reference cells but in which the N layer 22 is not nitrogen alloyed. Nitrogen alloying of layer 22 provides a significant efficiency improvement over a spectrum ranging from 350 nanometers to about 700 nanometers wavelength. When the sample cells are compared to the reference cell without a nitrogen compensated layer 22, the efficiency improvements in the range of 380 to 500 nanometers is even greater.

While the present invention has been illustrated and described with respect to particular structures and methods of fabrication, it is apparent that various modifications and changes can be made therein within the scope of the present invention as defined by the appended Claims.

What is claimed is:

1. A solar cell comprising:
    a transparent front face electrode,
    a first layer of hydrogenated amorphous silicon contacting said front electrode, said first layer doped with an impurity of P conductivity type,
    a second layer of hydrogenated amorphous silicon of essentially intrinsic conductivity, said second layer doped with nitrogen in a concentration of from two atomic percent to five atomic percent;
    a third layer of essentially intrinsic hydrogenated amorphous silicon contacting said second layer;
    a fourth layer of hydrogenated amorphous silicon contacting said third layer, said fourth layer doped with an impurity of N conductivity type; and
    means for contacting said fourth layer.

2. A solar cell according to claim 1 wherein said second silicon layer is from 20 to 1000 angstroms thick.

3. A solar cell according to claim 2 wherein said third silicon layer is from 4000 to 7000 angstroms thick.

4. A solar cell according to claim 1 wherein said second silicon layer is about 50 angstroms thick.

5. A solar cell according to claim 4 wherein said third silicon layer is from 4000 to 7000 angstroms thick.

6. A solar cell according to claim 1 wherein said fourth silicon layer is alloyed with nitrogen in a silicon to nitrogen atomic ratio of from about 3 to 1 to about 11 to 2.

7. In a solar cell having P, I, and N layers of hydrogenated amorphous silicon with said P layer forming a light receiving face of said cell, the improvement comprising:
    a fourth layer of hydrogenated amorphous silicon of essentially intrinsic conductivity, doped with nitrogen in a concentration of from two atomic percent to five atomic percent positioned between said I layer and the P layer forming the light receiving face of said cell.

8. The improved solar cell of claim 7 wherein said fourth silicon layer is from 20 to 1000 angstroms thick.

9. The improved solar cell of claim 8 wherein said I layer is from 4000 to 7000 angstroms thick.

10. The improved solar cell of claim 7 wherein said fourth silicon layer is about 50 angstroms thick.

11. The improved solar cell of claim 10 wherein said I layer is from 4000 to 7000 angstroms thick.

* * * * *